United States Patent [19]

Ryan

[11] 4,360,747

[45] Nov. 23, 1982

[54] VOLTAGE CONTROLLED SUBCARRIER PHASE SHIFTER

[75] Inventor: John O. Ryan, Cupertino, Calif.

[73] Assignee: Ampex Corporation, Redwood City, Calif.

[21] Appl. No.: 185,459

[22] Filed: Sep. 9, 1980

[51] Int. Cl.³ .................. H03K 5/153; G01R 25/04
[52] U.S. Cl. .................. 307/511; 307/530; 307/354; 307/228; 328/55; 328/223
[58] Field of Search .......... 328/55, 113, 223; 307/511, 350, 530, 354, 228

[56] References Cited

U.S. PATENT DOCUMENTS

| | | | |
|---|---|---|---|
| 2,912,576 | 11/1959 | Bacher | 328/223 X |
| 3,166,718 | 1/1965 | Zyskowski | 328/223 X |
| 3,569,842 | 3/1971 | Schroyer | 328/55 |
| 3,601,708 | 8/1971 | Stempler | 307/511 |

Primary Examiner—John S. Heyman
Attorney, Agent, or Firm—George B. Almeida; Joel D. Talcott

[57] ABSTRACT

The phase of an output subcarrier signal may be varied over a range of 360° with respect to the phase of an input subcarrier signal. A ramp generator which generates a ramp at one-half the subcarrier frequency, is coupled to a very fast differential comparator means whose output causes a subsequent tuned circuit to ring at the subcarrier frequency. Continuous oscillations, recycled every second subcarrier cycle, are generated as determined by the threshold set on the differential comparator means. A crystal filter reproduces the output subcarrier as a clean sinewave. Remotely controlled phase adjustment of from zero to 360° is provided by varying the threshold of the differential comparator.

10 Claims, 3 Drawing Figures

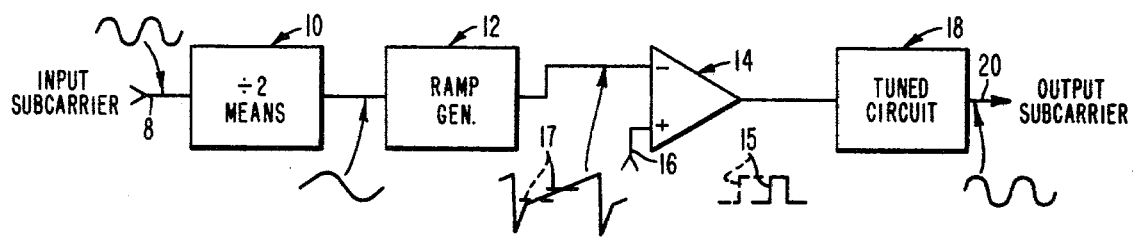
FIG_1
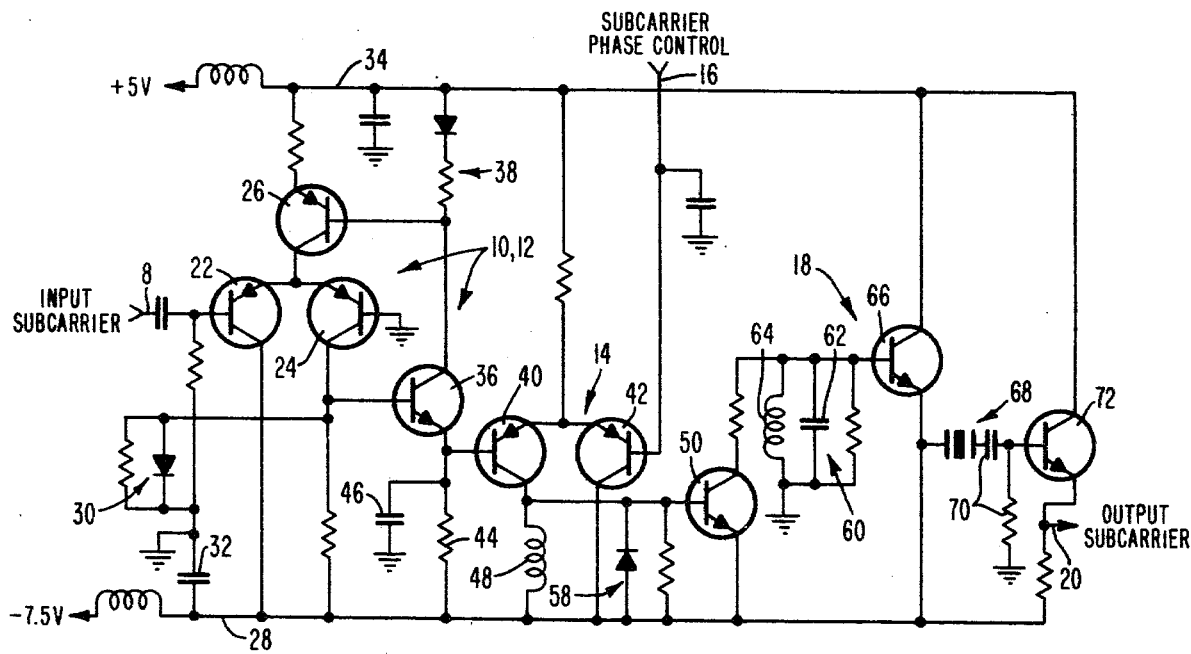
FIG_2
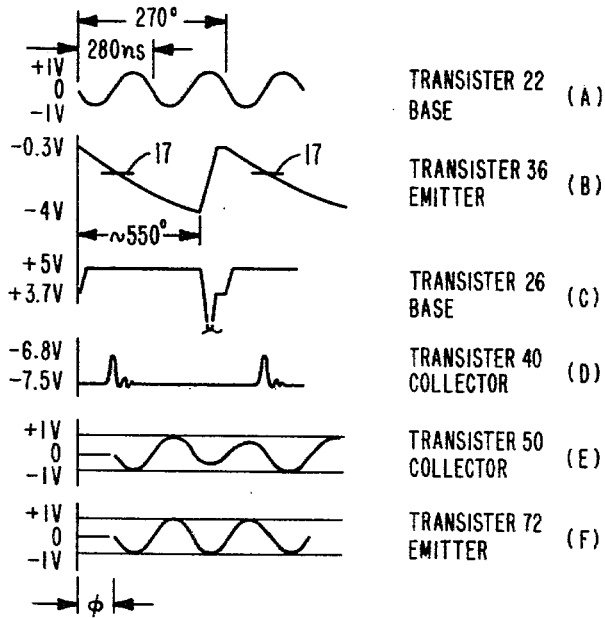
FIG_3

VOLTAGE CONTROLLED SUBCARRIER PHASE SHIFTER

CROSS REFERENCE TO RELATED APPLICATIONS

A Two Dimensional Interpolation Circuit for Spatial and Shading Error Corrector Systems, Ser. No. 139,512, filed Apr. 11, 1980, to John O. Ryan et al.

Digital Error Measuring Circuit for Shading and Registration Errors in Television Cameras, Ser. No. 139,604, filed Apr. 11, 1980, to Karl H. Griesshaber.

BACKGROUND OF THE INVENTION

The invention relates to circuits for controlling the phase of a sinewave, and particularly to a simple, temperature stable, voltage controlled phase shifter for remotely shifting the phase of an output signal relative to an input signal.

In the television field, wherein several hand-held and/or studio cameras are generating encoded pictures, it is necessary to control the phase of the subcarrier signal that is fed to the encoder. That is, each camera must not only be genlocked together, but must also be phased with respect to all other cameras in the studio. A phased condition is required, for example, whereby camera output signals fed to a switcher may be properly cut, mixed, faded, etc., without loss of color information.

Several separate procedures are employed to genlock cameras together. First, the camera's vertical system is locked to a vertical reference. Second, the horizontal system is locked to a horizontal reference. Third, the camera's subcarrier is locked to a subcarrier reference. However, although the frequencies are matched, there is no assurance that the cameras are phased, i.e., there may be phase differences due to different lengths of cable, etc. To date, phase adjustments for correcting any phase differences have been made by opening the side of a camera and manually making phase adjustment by means of a screwdriver. Such manual adjustments are particularly undesirable in the small, hand-held, high performance cameras of recent development, wherein the encoders are built into the camera head. Further, in a fully automated camera such as typified by the above cross-referenced applications, assigned to the same assignee as this application, such a scheme is cumbersome, time consuming and generally undesirable.

Remote controlled phase shifting is available in one example of the prior art, wherein a relatively complex two channel system is employed, first to make a coarse phase correction, and thereafter a fine phase correction. In the case of a portable camera, where space, size and power consumption are of utmost importance, such a complex system is correspondingly less desirable. Such a system is illustrated by way of example only, in U.S. Pat. No. 4,183,044 to D. W. Breithaupt.

The basic problem in the design of a subcarrier phase shifter is that of stability. Thus there is available a sinewave of an amplitude of generally two volts peak-to-peak. The phase shifting circuit should have the capability of varying the output signal with respect to the input signal over a range of at least 360°. However, in matching the two signals, the subcarrier phases must be detected and shifted within a degree or so of each other. One degree at the subcarrier frequency corresponds to a time increment of the order of two-thirds of a nanosecond in the NTSC color television standard, and even less time in the PAL standard. Therefore, it follows that the circuit must be as simple as possible and must be extremely stable with respect to temperature, drift, etc., while still providing the full range of 360° of control.

SUMMARY OF THE INVENTION

The invention overcomes the above mentioned shortcomings of the prior art by providing an extremely simple, yet very stable and accurate circuit, for remotely adjusting the phase shift of a subcarrier signal.

To this end, an input subcarrier is fed to a ramp generator which performs the dual functions of a divide-by-two circuit, while generating a ramp with very fast flyback at half the subcarrier frequency. The ramp is fed to a very fast differential comparator which also receives a control DC voltage level to set the threshold of the comparator. When the ramp level crosses the threshold level, the comparator generates a sharp pulse which causes a subsequent tuned circuit to ring at the subcarrier frequency to reproduce continuous, damped oscillations. The damped oscillations are refreshed every two subcarrier cycles to produce a slightly damped oscillation which is rich in harmonics. The oscillation is cleaned up via a crystal filter, which generates the output subcarrier as a clean sinewave at the subcarrier frequency.

The phase of the oscillation is determined by the sharp pulse and thus by the threshold voltage whereby the phase of the output subcarrier may be shifted from zero through 360° relative to that of the input subcarrier, by adjusting the threshold of the comparator.

BRIEF DESCRIPTION OF THE DRAWINGS

FIG. 1 is a block diagram depicting the underlying theory of the phase shifter of FIG. 2.

FIG. 2 is a schematic diagram exemplifying an implementation of the invention combination.

FIGS. 3A–3F is a graph depicting the waveforms generated at various points along the circuit of FIG. 2.

DESCRIPTION OF THE PERFERRED EMBODIMENTS

FIG. 1 is a simplified block diagram depicting the principle involved. An input subcarrier, in the form of a sinewave, is fed via input 8 to means 10 for dividing the subcarrier frequency by two. A ramp with very fast flyback is generated from the half frequency signal via a ramp generator 12, whereby the length of the ramp is two cycles of input subcarrier minus the flyback time. The ramp is applied to one input of a very fast differential comparator 14, while a DC control voltage is applied to the other input via a subcarrier phase control line 16. The output of the comparator 14 is a sharp pulse whose leading edge 15 corresponds in time to the threshold 17 set on the comparator 14 by the control voltage 16. That is, whenever the ramp level crosses the threshold level, the comparator 14 output goes high to generate the leading edge 15. The pulse is fed to a tuned circuit 18, whereby the leading edge 15 causes the tuned circuit to ring at the subcarrier frequency, to thus reproduce continuous oscillations, at the output 20, which defines the output subcarrier. The phase of the oscillations is uniquely determined by the edge 15 produced by the comparator 14, whereby the time of occurrance of the edge is determined in turn by the threshold voltage. Thus, adjusting the control voltage on line 16 to the comparator 14, likewise adjusts the phase of the input subcarrier, over a range of zero through 360°.

It is rather difficult to implement the block diagram of FIG. 1 with a divider circuit, since the phase shifter must have a very small, very stable delay. Accordingly, the schematic diagram of FIG. 2 depicts a circuit which achieves a divide-by-two function while also generating the ramp of one-half subcarrier frequency, without the need for divider circuits, etc. The circuit is very simple and thus readily added to a portable, high performance camera, has essentially no delay, and thus is very stable with respect to temperature, drift, etc.

Accordingly, referring to FIG. 2 wherein like components are similarly numbered, the input subcarrier on input 8 comprises a sinewave of 2 volts peak-to-peak at the subcarrier frequency of 3.58 megaHertz (MHz) for the NTSC color television standard, and 4.43 MHz for the PAL standard. Thus one cycle interval of subcarrier is approximately 280 nanoseconds (ns) in NTSC, as depicted in FIG. 3A. Input 8 is coupled to the base of a transistor 22 of a transistor pair 22, 24. The emitters thereof are coupled together and thence to the collector of a transistor 26. The collector of transistor 22 is coupled to a common reference −7.5 volt source at 28. The collector of transistor 24 is coupled to the −7.5 volt source via a resistor, and to ground via a parallel resistor and a Schottky diode 30. The common −7.5 volt source is derived via a −7.5 volt supply and inductor, and is coupled to ground via a bypass capacitor 32. The base of transistor 24 is grounded.

The emitter of the transistor 26 is coupled to a reference +5 volt source 34 configured as the −7.5 volt source 28. The base of transistor 26 is coupled to the collector of a transistor 36 as well as to the +5 volt source via a diode/resistor circuit 38. The base of the transistor 36 is coupled to the collector of the transistor 24, while the emitter of the former is coupled to the base of a transistor 40 of a pair of transistors 40, 42 which form the differential comparator 14 of previous mention. The emitter of transistor 36 is also coupled to the −7.5 volt source 28 via a resistor 44, and to ground via a capacitor 46. The emitters of transistors 40, 42 are joined and coupled to the +5 volt source 34 via a resistor. The collector of transistor 42 is coupled to the −7.5 volt source 28. The collector of transistor 40 is coupled to source 28 via an inductor 48, and also provides the output from the comparator 14 to the base of a transistor 50. The base of transistor 42 is coupled to ground via a capacitor and provides the control command input line 16 for applying the subcarrier phase control command of previous mention to control the threshold level (17 of FIGS. 1,3) of the comparator 14.

The base of transistor 50 also is coupled to the −7.5 volt source 28 via a diode/resistor 58, and the emitter is coupled to the source 28. The collector of the transistor 50 is coupled to a tuned circuit 60, formed essentially of a capacitor and inductor 62, 64, which is coupled to the base of a transistor 66. The collector and emitter of transistor 66 are respectively coupled to the +5 and −7.5 volt sources 34, 28. The emitter also is coupled to a crystal filter 68, which includes the capacitor/resistor 70, and which is resonant at the subcarrier frequency of 3.58 MHz in the NTSC color television standard, and at 4.43 MHz in the PAL standard. The filter 68 output is coupled to an emitter follower transistor 72 which forms an output stage to supply the resulting subcarrier to the subsequent encoder via the output 20.

In operation, referring to FIGS. 2 and 3A–3F, a signal of, for example, 2 volts peak-to-peak, such as the incoming subcarrier on input 8 (FIG. 3A) will switch the transistor 22 on and off. Assume that the transistor 24 is turned on by virtue of the sum of the input voltages being positive and turning transistor 22 off. The transistor 24 collector goes up to, for example, about +0.4 volt. The Schottky diode 30 keeps the transistor 24 out of saturation, thus eliminating storage time. The emitter voltage of transistor 36 will thus be 0.7 volts below that, viz, about −0.3 volt (FIG. 3B). Therefore, the capacitor 46 is also charged to about −0.3 volt.

As the subcarrier sinewave of FIG. 1A continues through its first cycle, it switches transistor 22 on and transistor 24 off. The collector voltage of transistor 24 drops to some very negative value, e.g., about −3.5 volts, but the emitter voltage of the transistor 36 stays at its prior voltage of about −0.3 volt by virtue of the capacitor 46. The resistor 44 then proceeds to discharge the capacitor 46 towards the reference −7.5 volt source 28. The discharge is logrithmic as depicted in FIG. 3B.

The base voltage of the transistor 36, when it was turned off, dropped to some negative voltage such as about −3.3 volts. When the emitter voltage of transistor 36 drops to about −4 volts, the transistor 36 will begin to turn on again. In doing so, the current flowing through the transistor 36 by virtue of the diode/resistor 38, will turn on the transistor 26 which provides current again to the input differential pair of transistors 22, 24. This produces a very fast regenerative action (FIG. 3C) which causes transistor 24 to switch on very rapidly, pulling up the base of transistor 36. This charges the capacitor 46 very rapidly back up to its initial value of −0.3 volt (FIG. 3B). The capacitor voltage is held until the subcarrier goes through about one-half cycle, i.e., goes below ground, at which time the transistor 24 cuts off again and the whole cycle repeats itself.

Thus, a negative going logrithmic ramp with a very short flyback period is generated at the emitter of transistor 36, wherein the length of the ramp is about 1½ cycles of the input subcarrier signal, i.e., about 550° (FIG. 3B). By virtue of selecting the time constant of the capacitor 46/resistor 44, the time of discharge is controlled, thus assuring that the circuit only triggers on every second cycle of the incoming sinewave. Accordingly, the above circuit provides a very fast, stable, divide-by-two means combined with a ramp generator as well.

The ramp so generated is then applied to a differential comparator, with threshold control applied to one input, whereby a full 360° range (preferably a 370° range) is picked off the approximately 550° range generated (FIG. 3B), by selecting the operating voltages of the comparator 14.

The emitter of the transistor 36 supplies the ramp to one input of the comparator 14, i.e., the base of the transistor 40, while the subcarrier phase control command is applied via line 16 to the other input, i.e., the base of transistor 42. The control command on line 16 is a DC voltage which may be varied from −1 to −3 volts. Phase adjustment is provided by selectively varying the DC control voltage which, in turn, sets the threshold 17 (FIG. 3B) of the comparator 14. The threshold determines where the sawtooth waveform is sliced.

Thus, when the control voltage on the base of transistor 42 goes more positive than the base of transistor 40, the latter turns on, and its collector current causes a sharp voltage pulse (FIG. 3D) to appear across the inductor 48. The pulse appears within the 370° range selected on the sawtooth, at a point determined by the location of the threshold level. The sharp pulse saturates the following transistor 50 very rapidly, which causes the tuned circuit 60 to ring. If the tuned circuit were allowed to continue ringing it would generate a form of damped oscillation. However, the sharp voltage pulse is repeated every two cycles, which pumps the oscillation to generate a slightly damped oscillation at the subcarrier frequency as depicted in FIG. 3E, which further is rich in harmonics.

This oscillation is fed via the transistor 66 to the crystal filter 68, which is very stable and resonant at the subcarrier frequency. The filter 68 removes virtually all the harmonics and produces a clean sinewave at the base of the output transistor 72. The latter supplies the output subcarrier corresponding to the sinewave of FIG. 3F, via its emitter and the output 20.

Thus the phase shifter circuit of description herein receives an input sinewave of given frequency, and generates an output sinewave of the same frequency, wherein the phase difference between the input and output sinewaves can be remotely adjusted, over at least a 360° range via the subcarrier phase control command. The circuit is temperature stable since it utilizes very fast components with no storage time and thus negligible delay. The simplicity of the circuit allows it to be readily included in very small and thus portable, high performance cameras, with a fully automatic setup system. Thus the circuit provides a simple, compact system for remotely controlling the phase of a subcarrier signal.

What is claimed is:

1. A circuit for shifting the phase of an input signal of given frequency, comprising;
    input transistor means including a differential transistor pair coupled at one transistor to the input signal and responsive thereto;
    ramp transistor means operatively coupled to the differential transistor pair at a second transistor;
    RC network means coupled to the ramp transistor means for generating a ramp having a time period greater than one cycle of the input signal;
    means coupled to the RC network for selecting a threshold on the ramp in response to a desired phase shift; and
    output means coupled to the means for selecting for generating oscillations at said given frequency in response to the selected threshold level to define a shifted output signal.

2. The shifter of claim 1 wherein said means for selecting include;
    differential comparator means disposed to receive the ramp; and
    control means coupled to the differential comparator means for setting the threshold commensurate with the desired phase shift for the output signal.

3. The shifter of claim 2 wherein the RC network means further include;
    capacitor means responsive to the differential transistor pair for generating the ramp during the capacitor means discharge; and
    a resistor coupled to the capacitor means.

4. The shifter of claim 3 further including;
    third and fourth transistors of said input transistor means whose emitters are connected together;
    fifth transistor whose collector is coupled to the joined emitters, and whose base is coupled to the collector of the ramp transistor;
    diode means coupled to the base of the fifth transistor;
    the bases of the third and fourth transistor being coupled to the input signal and to ground respectively; and
    the collector of the fourth transistor being coupled to the base of the ramp transistor.

5. The shifter of claim 3 wherein the differential comparator means includes;
    emitter-coupled transistors including a first transistor coupled to the RC network and a second transistor coupled to the control means;
    inductor means coupled to the first transistor; and
    wherein the comparator means provides a sharp pulse in response to the ramp and the threshold voltage levels.

6. A phase shifter for remotely shifting the phase of an output signal of selected frequency relative to an input signal of the same frequency, comprising;
    means for generating a ramp having a time period of the order of 1½ cycles and a frequency of one-half that of the input signal, and including capacitor means responsive to the transistor means for generating the ramp during the capacitor means discharge;
    means including differential comparator means for selecting a threshold on the ramp, and further including control means coupled to the differential comparator means for setting the threshold commensurate with the desired phase shift for the output signal;
    output means coupled to the means for selecting for generating oscillations at the signal frequency when the ramp level selectively matches the threshold level; and
    wherein the means for generating a ramp further includes input transistor means having a transistor pair for receiving the input signal, a resistor coupled to the capacitor means to define an RC network, a ramp transistor coupled to the RC network for generating the ramp in response to the transistor pair, third and fourth transistors whose emitters are connected together to define the transistor pair, fifth transistor whose collector is coupled to the joined emitters and whose base is coupled to the collector of the ramp transistor, diode means coupled to the base of the fifth transistor, wherein the bases of the third and fourth transistors are coupled to the input signal and to ground respectively, and wherein the collector of the fourth transistor is coupled to the base of the ramp transistor.

7. A phase shifter for remotely shifting the phase of an output signal of selected frequency relative to an input signal of the same frequency, comprising;
    means for generating a ramp having a time period of the order of 1½ cycles and a frequency of one-half that of the input signal, and including capacitor means responsive to the transistor means for generating the ramp during the capacitor means discharge;
    means including differential comparator means for selecting a threshold on the ramp, and further including control means coupled to the differential comparator means for setting the threshold commensurate with the desired phase shift for the output signal;

output means coupled to the means for selecting for generating oscillations at the signal frequency when the ramp level selectively matches the threshold level;

wherein the means for generating a ramp further includes input transistor means having a transistor pair for receiving the input signal, a resistor coupled to the capacitor means to define an RC network, a ramp transistor coupled to the RC network for generating the ramp in response to the transistor pair; and the differential comparator means includes, emitter-coupled transistors including first and second transistors coupled to the RC network and to the control means respectively, inductor means coupled to the first transistor, and wherein the comparator means provides a sharp pulse in response to the ramp and the threshold voltage levels.

8. The shifter of claim 5 or 7 wherein the output means includes;

a tuned circuit coupled to the inductor means;

output transistor means integral with the tuned circuit and responsive to the sharp pulse from the comparator means to cause the tuned circuit to ring.

9. The shifter of claim 8 further including;

crystal filter means coupled to the tuned circuit for providing the output signal from the oscillations caused by the ringing.

10. The shifter of claim 9 further including;

diode means coupled to the transistor pair of the input transistor means to prevent transistor saturation.

* * * * *